United States Patent
Ervin et al.

(10) Patent No.: US 8,835,994 B2
(45) Date of Patent: Sep. 16, 2014

(54) REDUCED CORNER LEAKAGE IN SOI STRUCTURE AND METHOD

(75) Inventors: Joseph Ervin, Hopewell Junction, NY (US); Jeffrey B. Johnson, Essex Junction, VT (US); Paul C. Parries, Wappingers Falls, NY (US); Chengwen Pei, Danbury, CT (US); Geng Wang, Stormville, NY (US); Yanli Zhang, South Burlington, VT (US)

(73) Assignee: International Business Machines Corporation, Armonk, NY (US)

(*) Notice: Subject to any disclaimer, the term of this patent is extended or adjusted under 35 U.S.C. 154(b) by 738 days.

(21) Appl. No.: 12/791,372

(22) Filed: Jun. 1, 2010

(65) Prior Publication Data

US 2011/0291169 A1    Dec. 1, 2011

(51) Int. Cl.
| | |
|---|---|
| H01L 29/76 | (2006.01) |
| H01L 29/94 | (2006.01) |
| H01L 29/786 | (2006.01) |
| H01L 27/12 | (2006.01) |
| H01L 21/84 | (2006.01) |
| H01L 29/66 | (2006.01) |
| H01L 27/108 | (2006.01) |
| H01L 21/762 | (2006.01) |

(52) U.S. Cl.
CPC ........ H01L 21/76283 (2013.01); H01L 29/945 (2013.01); H01L 29/78696 (2013.01); H01L 29/78609 (2013.01); H01L 29/78603 (2013.01); H01L 27/1203 (2013.01); H01L 21/84 (2013.01); H01L 29/66181 (2013.01); H01L 27/1087 (2013.01); H01L 27/10873 (2013.01)

USPC .... 257/288; 257/240; 257/243; 257/E29.049; 257/E21.633

(58) Field of Classification Search
CPC .................................................. H01L 29/1025
USPC .......................... 257/E29.049, 288, E21.633
See application file for complete search history.

(56) References Cited

U.S. PATENT DOCUMENTS 5,719,085 A    2/1998 Moon et al.
(Continued)

OTHER PUBLICATIONS

C.P. Chang et al., "A Highly Manufacturable Corner Rounding Solution for 0.18um Shallow Trench Isolation", 0/7803-4100-7/97/$10.00, 1997, IEEE, pp. 661-664.

(Continued)

Primary Examiner — Ha Tran T Nguyen
Assistant Examiner — Aaron Dehne
(74) Attorney, Agent, or Firm — Whitham, Curtis, Christofferson & Cook, P.C.; Joseph P. Abate (57) ABSTRACT

A structural alternative to retro doping to reduce transistor leakage is provided by providing a liner in a trench, undercutting a conduction channel region in an active semiconductor layer, etching a side, corner and/or bottom of the conduction channel where the undercut exposes semiconductor material in the active layer and replacing the removed portion of the conduction channel with insulator. This shaping of the conduction channel increases the distance to adjacent circuit elements which, if charged, could otherwise induce a voltage and cause a change in back-channel threshold in regions of the conduction channel and narrows and reduces cross-sectional area of the channel where the conduction in the channel is not well-controlled; both of which effects significantly reduce leakage of the transistor.

17 Claims, 5 Drawing Sheets

(56) References Cited

U.S. PATENT DOCUMENTS

| | | | |
|---|---|---|---|
| 6,103,581 A | 8/2000 | Lin et al. | |
| 6,235,643 B1 | 5/2001 | Mui et al. | |
| 7,148,120 B2 | 12/2006 | Chen et al. | |
| 2003/0181047 A1 | 9/2003 | Chang | |
| 2006/0105536 A1* | 5/2006 | Cheng et al. | 438/386 |
| 2006/0160292 A1* | 7/2006 | Anderson et al. | 438/199 |
| 2006/0276001 A1 | 12/2006 | Ogawa | |

OTHER PUBLICATIONS

N. Wang et al., "Fabrication of Improved FD SOIMOSFETs for Supressing Edge Effect", 978-1-4244-2186-2/08/$25.00, 2000 IEEE.

H. Cho et al., "A Low Power, Highly Scalable, Vertical Double Gate MOSFET Using Novel Processes", 1-4244-1102-5/07/$25.00, 2007 IEEE.

* cited by examiner

REDUCED CORNER LEAKAGE IN SOI STRUCTURE AND METHOD

FIELD OF THE INVENTION

The present invention generally relates to semiconductor integrated circuit devices and, more particularly, to reduction of current leakage in transistors, particularly in association with storage capacitors in memories.

BACKGROUND OF THE INVENTION

Demands for increased performance, functionality and economy of manufacture of semiconductor integrated circuits have driven the decrease of minimum lithographic feature size and increase of integration density to extreme levels to the point that millions of discrete devices may be formed on a single chip and spaced from each other by distances measured in hundreds or even tens of nanometers. However, as devices such as transistors and capacitors are scaled to smaller sizes, performance may be degraded significantly and highly sophisticated designs for transistors, capacitors and the like have been developed to maintain and even enhance performance of individual devices formed at sizes at the limits of or even exceeding lithographic resolution.

Further, as integration density has been increased (which, among other beneficial effects, reduces signal propagation time and noise susceptibility) some undesired effects have been discovered. Specifically, when transistors have been scaled to smaller sizes, the so-called on/off ratio of channel resistance has been decreased both by reduction of conduction channel cross-section increasing resistance when a transistor is in the "on" state and by leakage in the "off" state due to reduced ability to control conduction from the transistor gate at low voltages necessary to answer heat dissipation design constraints. It has also been recently discovered that, at extremely high integration densities, difficulty in increasing "off" state resistance of transistors and limiting transistor leakage has been encountered even with extremely sophisticated and difficult to manufacture transistor designs with limited manufacturing yield.

These difficulties are particularly critical in high capacity dynamic memories (or high density dynamic memories of lesser capacity which are desirably integrated on the same chip with extensive logic or digital processing circuitry) where data may be stored as a few hundred or fewer individual electrons. In such an application where the storage mechanism is necessarily highly ephemeral, leakage of a relatively few electrons can change data states of a stored bit and relatively high refresh rates are required to prevent data corruption. High refresh rates, in turn, consume significant time as well as power and increase worst case memory access time; severely compromising potential performance. Further, even with the provision of redundant circuitry for a chip design, improper formation of a relatively small number of elements on the chip (where the number of such elements is greatly increased to provide desired increase of integration density and memory capacity) can result in a chip which cannot be made fully functional.

SUMMARY OF THE INVENTION

It is therefore an object of the present invention to provide a solution to transistor leakage problems which have proven intractable at high integration density.

It is another object of the present invention to provide a novel transistor structure having a reliably increased "off" resistance and reduced leakage which can be produced by a relatively simple process exhibiting very high reliability and robustness which does not compromise manufacturing yield.

In order to accomplish these and other objects of the invention, a transistor and memory cell are provided comprising a gate structure and source and drain regions and a conduction channel extending between said source and drain regions, wherein a lower portion of the conduction channel is shaped to avoid inclusion of a portion of a leakage path.

In accordance with another aspect of the invention, an integrated circuit is provided including a transistor and another circuit element such as a storage capacitor formed in such proximity to each other that charge on the another element causes a change in threshold voltage in a region of a channel of the transistor opposite a gate structure of the transistor, including a region of insulator located to reduce conduction channel cross-section in a region overlaid by the gate structure and most proximate to the another circuit element.

In accordance with a further aspect of the invention, a method of forming a transistor of a semiconductor integrated circuit in an active layer overlying another layer or substrate, said method comprising steps of etching through the active layer adjacent a transistor location to form a trench, applying a liner in the trench, etching the another layer or substrate to increase depth of the trench and undercut a portion of the active layer and expose the active layer a recessed and undercut region, etching the active layer exposed by that etching, and depositing insulator material where material has been removed by the etching steps.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
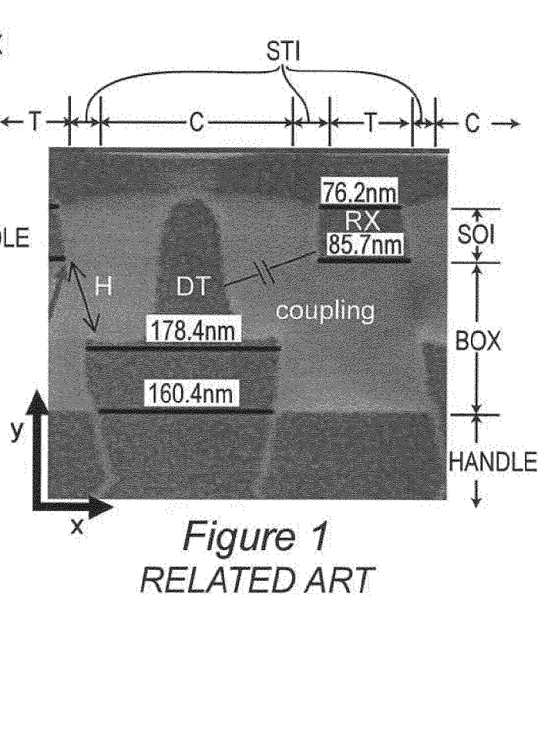
FIG. 1 is a photomicrograph of a cross-section of a memory cell (taken across the width of the transistor channel illustrating the problem addressed by the invention, FIG. 2 is a three dimensional diagram of a simulation of electron density in the structure of FIG. 1, FIG. 3 is an idealized diagram of a cross-section (also taken across the width of the transistor channel) in accordance with the invention, and FIGS. 4, 5 and 6 are a sequence of diagrams illustrating formation of a transistor for a high density dynamic memory structure in accordance with the invention.

Referring now to the drawings, and more particularly to FIG. 1, there is shown a photomicrograph of a cross-section across the width of the upper portion of an exemplary deep trench capacitor of an exemplary dynamic memory cell and a transistor for providing a controllable connection to the capacitor. It should be understood that while FIG. 1 does not include a depiction of the invention, no admission is made that any portion of FIG. 1 is prior art in regard to the present invention and is thus designated as "related Art". A portion of an adjacent transistor and a portion of an adjacent capacitor of respective adjacent memory cells are also visible in FIG. 1. In any integrated circuit dynamic memory array where data is stored as charge, it is of paramount importance to design the storage capacitor, C, to have as large a capacitance value as possible consistent with the "footprint" area available to obtain the desired number of memory cells on a chip of a given, desired size in order to store a maximum amount of charge at a given voltage. It is also desirable to provide isolation in the form of an isolation structure between the storage capacitor and the area in which the access or control transistor, T, is formed, in this case, shallow trench isolation, STI; the respective cross-sectional dimensions of the transistor, T, the storage capacitor, C, and the shallow trench isolation structure, STI, being indicated by double arrows, so-labeled. In addition to the isolation structure, it is desirable to provide as much space as possible between the transistor structure and the connection to the storage capacitor, the connection often being referred to as a storage node that, while contributing to the storage of charge, need not be as large as the body of the storage capacitor. Such space reduces the criticality of wiring formation between the transistor and the capacitor and additional wiring to control the transistor and to connect the transistor and the capacitor to other structure of the memory such as a memory driver or sense amplifier.

Additionally, it is common practice at the current state of the art, to form dynamic memories and other particularly critical semiconductor structures on so-called silicon-on-insulator or semiconductor-on-insulator (SOI) substrates due to the higher quality of silicon or other semiconductor crystalline structure that can be formed on a particular insulator, such as an oxide, and some other well-recognized advantages in electrical properties, such as limiting transistor channel depth, and manufacturing process sequences. As is well-known, SOI substrates are characterized by having a thin layer of active semiconductor material, referred to as an SOI layer, formed on an insulator layer (generally an oxide) which is, in turn, formed on a more robust semiconductor substrate, generally referred to as a "handling substrate" or, simply, "handle". The insulating layer is thus, often referred to generically as a "buried oxide" or "BOX", regardless of actual composition. Such a wafer structure is particularly advantageous for dynamic memories since the transistor depth can be limited by the thickness of the SOI layer and the major portion of the capacitor body can be formed in the handling substrate by the simple processes of forming an insulator (e.g. by oxidation and/or deposition of nitride) and deposition of a conductive material such as metal, doped semiconductor or an alloy thereof since the handling substrate can, itself, be used as a capacitor plate of all of the capacitors in the array or a partition of the array (which, itself, may also be regarded as an array). Further, the major portions of the capacitors (e.g. the portion other than the storage node extending through the BOX and SOI layer locations) is in a different plane and vertically spaced from the transistors in the SOI layer; allowing the storage capacitors to be larger in surface area and more closely spaced.

Accordingly, the invention will be explained in connection with a so-called "bottled" deep trench (DT) storage capacitor design and an SOI wafer structure since such a design is currently preferred for carrying out or embodying the invention to particular advantage. However, it is to be understood that the invention is applicable to other designs and wafer types that are known or are foreseeable. However, it is likely that dynamic memories will continue to be fabricated with the transistors and the major portions of the capacitor bodies and transistors in different planes to conserve chip area and concurrently maximize both circuit element density in plan view and may, in the future, include designs where portions of the transistors actually overlay portions of the capacitors, to which the invention will be particularly applicable and similarly advantageous to the currently preferred embodiment which will now be described.

In this regard, it should be noted that in the photomicrograph cross-section of FIG. 1, the portion of the bottled DT capacitor visible to the right of the transistor is very closely spaced from or substantially aligned with the edge of the transistor T although the connection or storage node portion is significantly recessed therefrom at least to the depth of the BOX layer (e.g. through the SOI layer) while the bottled DT capacitor to the left of the transistor is separated from the transistor T by a somewhat greater distance. Similarly, the portion of the transistor visible to the left of the bottled DT capacitor C is substantially aligned with the left side of capacitor C. These spacings are not critical to the practice of the invention other than to observe that some space is present between the transistor channel and the connection to the storage capacitor while the body of the capacitor, below the level of the transistor, could, in theory, be very close to, aligned with or even extend under the transistor. Thus it should be appreciated that designs exist at the present state of the art or are foreseeable where, in plan view, the transistor footprint may be very close to at least a portion of the capacitors which may influence transistor operation.

Specifically, it will be noted from FIG. 1 that there is a separation H between the (e.g. each) transistor and the capacitors adjacent to it. It will also be appreciated that some degree of capacitive coupling will be present across that separation distance, as schematically illustrated in FIG. 1. It will also be understood by those skilled in the art that such capacitive coupling is a function of electric fields in the bulk of the semiconductor material forming the memory cell and that such electrical fields affect the charge (e.g. electron or hole) density in various parts of the structure as will now be discussed in connection with FIG. 2.

Figure 2:
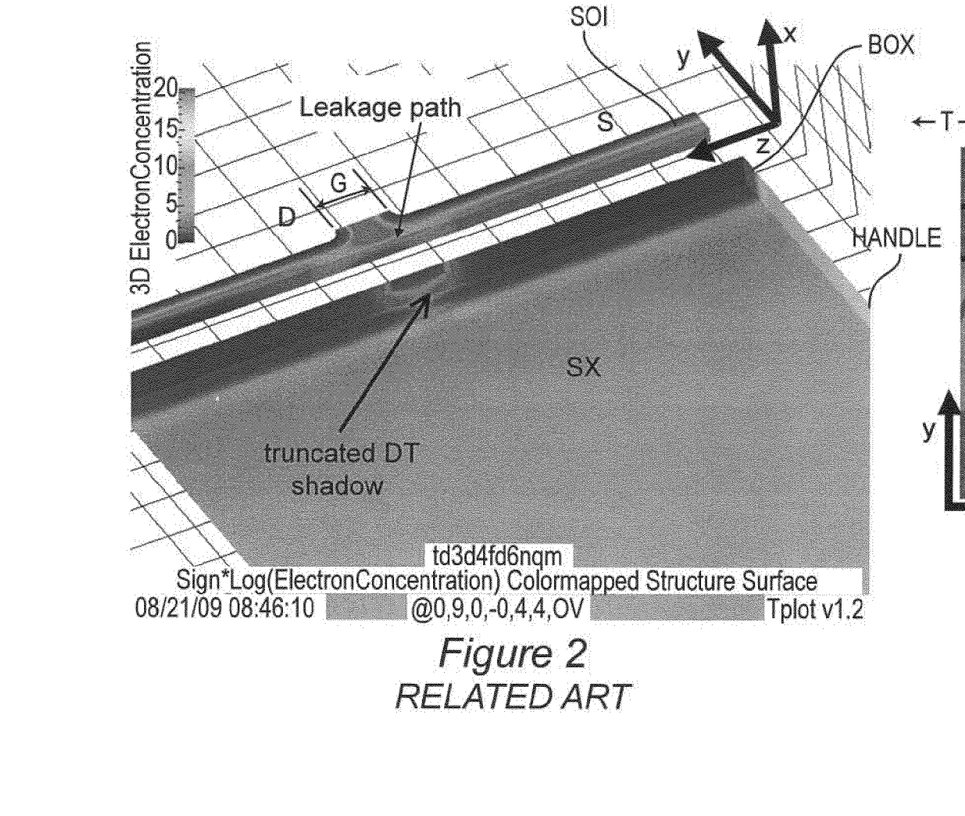

FIG. 2 is a substantially isometric view of a three dimensional plot of results of a simulation of the absolute value of charge density (indicated by shading) due to capacitive coupling across dimension H shown in FIG. 1. Accordingly, as with FIG. 1, no portion of FIG. 2 is admitted to be prior art in regard to the present invention and, like FIG. 1, is also designated "Related Art". It is assumed that the voltage applied to transistor T is appropriate to the "off" state of the transistor and that charge is stored on one or both adjacent storage capacitors. (The particular simulation results illustrated correspond to the effects between a single capacitor and a single NFET transistor.) The three coordinate axes indicated in FIG. 2 correspond to those shown in FIG. 1 with the z-axis being perpendicular to the plane of the cross-section depicted in FIG. 1. Gate region G (below the gate dielectric), drain region D and source region S of the transistor are indicated along the z-axis. The active SOI and BOX layers and handle substrate SX are indicated along the y-axis. It will be noted from FIG. 2 that a truncated DT shadow of increased stored charge density occurs in the handle substrate due to the hole charge stored on the capacitor(s) in substantial alignment with one side of the transistor gate G where the side of the gate and the side of the capacitor are in greatest proximity. This increase in density, in turn, induces an increase in electron density in the SOI layer, also in substantial alignment with gate region G but in the lower portion of the conduction channel remote from the gate electrode and dielectric where the voltage on the gate electrode is less effective to control electron density and transistor conduction. (In the above discussion of FIG. 2, the roles of electrons and holes would be reversed in the case of a PFET transistor.)

Therefore, without wishing to be held to any particular theory underlying such an effect, it is believed that a leakage path is formed in the lower portion of the conduction channel where the truncated DT shadow serves to cause a reduction in the voltage threshold, Vt, of the lower portion of the channel (referred to as back channel Vt) below the voltage threshold of the upper portion of the conduction channel which must generally, at the present state of the art, be held very low (from zero volts to about one-half of the negative power supply voltage) and gating of the lower portion of the conduction channel into at least a partially conductive state; thus causing leakage of current from the capacitor to which it is connected. This effect may be caused by the field produced by the capacitor controlled by the transistor or the field produced by the capacitor of an adjacent memory cell (in which case the effect is similar to a cross-talk effect, but where the "cross-talk" is manifested in an alteration of electrical characteristics of a device rather than being manifested as electrical noise due to the capacitive coupling of a signal) or both. By the same token, the invention is applicable to other elements in structures having designs that may place the elements in close proximity such that the electrical characteristics of the elements themselves may be affected even though significant electrical noise is not caused.

An approach to this problem prior to the present invention has been to apply severe doping by implantation at an energy which causes a peak in impurity distribution at a location deep within and near the bottom of the SOI layer, referred to as "retro doping", to increase Vt in the lower region of the SOI layer and conduction channel while, in theory, leaving the voltage threshold near the surface of the SOI layer and controlled by the transistor gate at the level chosen for the transistor design. However, since the impurity of choice to raise the threshold of the N-type transistors preferred for high integration density memory cells is boron, retro doping is not ideally effective since the impurity concentration distribution is characterized by a long "tail" above and below the location of the concentration peak. Moreover, boron has a relatively high diffusivity in silicon and other semiconductor materials and the expected thermal budget for memory fabrication will cause boron to diffuse from the location and distribution that can be achieved by implantation. Therefore, it can be readily appreciated that it is very difficult to decouple the voltage threshold of the transistor near the gate structure from the requirements of the back channel Vt to obtain acceptably low leakage through retro doping, particularly where the scaling of the memory cell and increase in overall integration density tend to enhance the back channel gating effect. In other words, when retro doping is used to increase the back channel Vt, the effects of the dopant are also coupled to a substantial degree to the portion of the channel adjacent the gate structure and such coupling cannot be easily avoided or even effectively limited.

Figure 3:
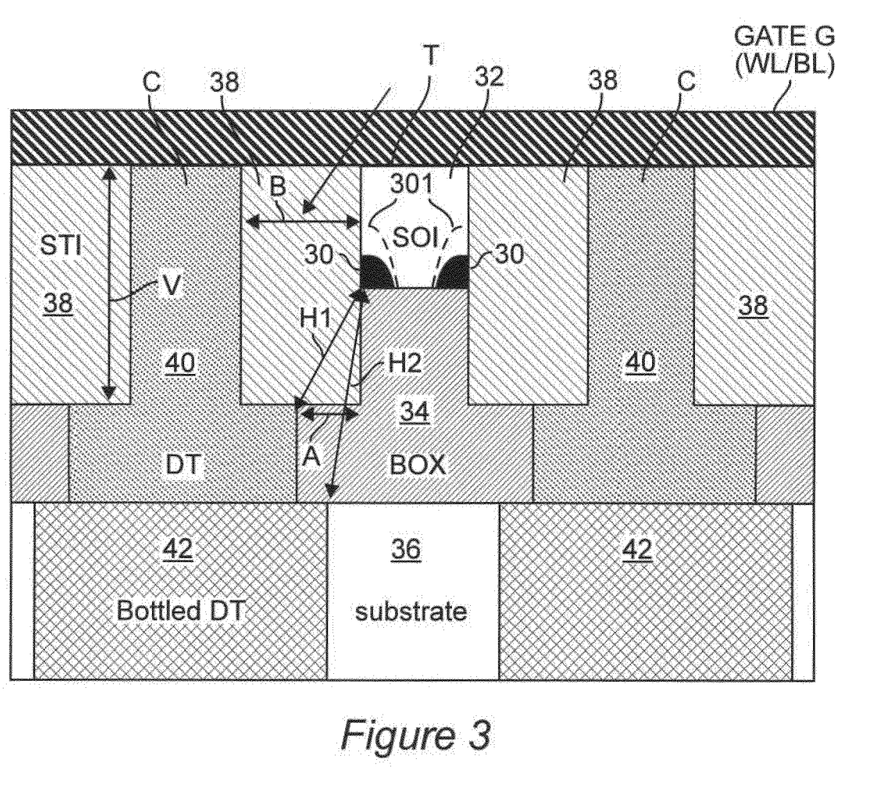

Referring now to FIG. 3, the solution provided by the invention to development of the parasitic gating effect described above will now be described and explained. FIG. 3 should be understood as an idealized depiction of a substantially complete memory cell as formed on an SOI type wafer. The portions of the SOI 32 and BOX 34 layers and the upper portion 36 of the handle substrate after formation of transistor T and capacitor C are shown in order from top to bottom in the central portion of FIG. 3. It will be noted from a comparison of FIG. 3 with the photomicrograph of FIG. 1 that the principal difference is regions 30 on the lower corners of the transistor conduction channel (formed in the SOI layer 32) of transistor T, the formation of which will be discussed in detail below in connection with FIGS. 4-6. Since capacitive coupling is a function of distance or separation of opposing surface areas or regions as well as dielectric constant of intervening material, the capacitive coupling will be essentially determined by the shortest distances between conductive structures. That is, in FIG. 3 and in the absence of regions 30, distance H in FIG. 1 is depicted schematically as two components: H1 and H2. These distances to a corner of the DT connection/storage node 40 and a corner of the bottled DT capacitor body, respectively, are affected by the magnitudes of distances indicated by arrows A and B, which should both be as small as possible for maximum integration density and low resistance of the DT connection to the bottled DT capacitor body (to increase the cross-sectional dimensions thereof as well as surface area to increase capacitance although dimension B must be sufficient to avoid significant capacitive coupling to the sides of the transistor channel region T), and arrow V which may be limited by the ability to form high aspect ratio STI structures.

Thus, in accordance with the invention, since it is difficult, consistent with other design goals and high-yield manufacturing processes to increase distances H1 and H2, regions 30 formed of insulating material (or, possibly, a void filled with any gas) are provided at the lower corners of conduction channel of transistor T formed in the SOI layer 32. The effects on leakage in transistor T due to provision of regions 30 are thus two-fold: first, to decrease the capacitive coupling between the storage capacitor boundary and the conduction channel to limit induced change of electron density as discussed above in connection with FIG. 2 and, second, to physically narrow the bottom (e.g. remote from the gate electrode and dielectric) of the conduction channel by decreasing the cross-sectional area of the conduction channel in the region where conduction is not as well-controlled by the gate voltage as in the region more proximate to the gate electrode to thereby increase resistance of the lower portion of the channel through reduction of cross-sectional area as well as reducing the proportion of the channel cross-section where charge density is not well-controlled by the gate electrode. This latter effect will also increase the "on" resistance of the transistor but such effects may be controllably limited and, in any case, the on/off resistance ratio will be increased and leakage is significantly reduced. The magnitude of these effects of reducing transistor leakage are largely a function of the cross-sectional size and shape of regions 30 which can be varied in a reliably controllable and repeatable manner as will now be explained in connection with FIGS. 4-6.

Figure 4:
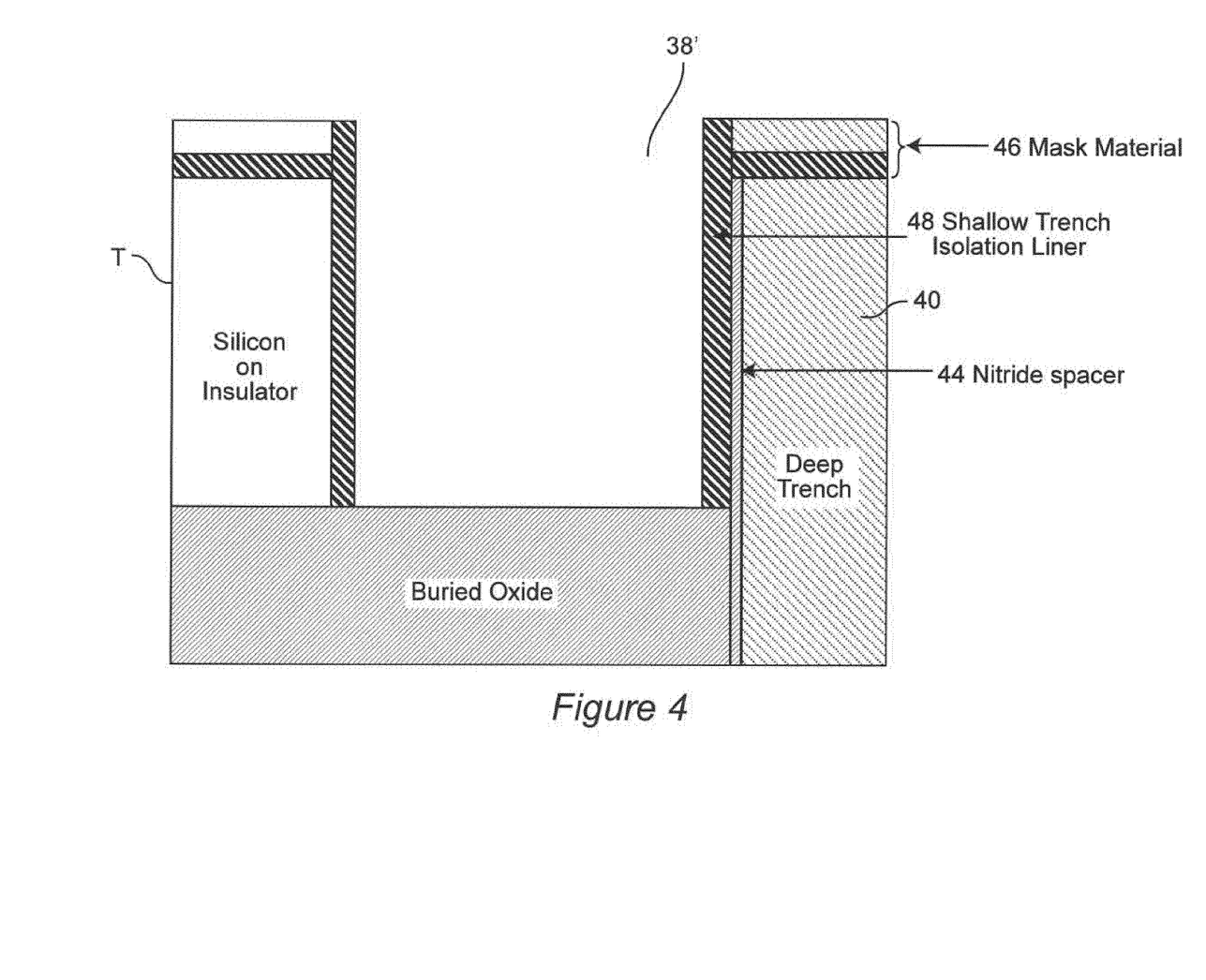
Figure 5:
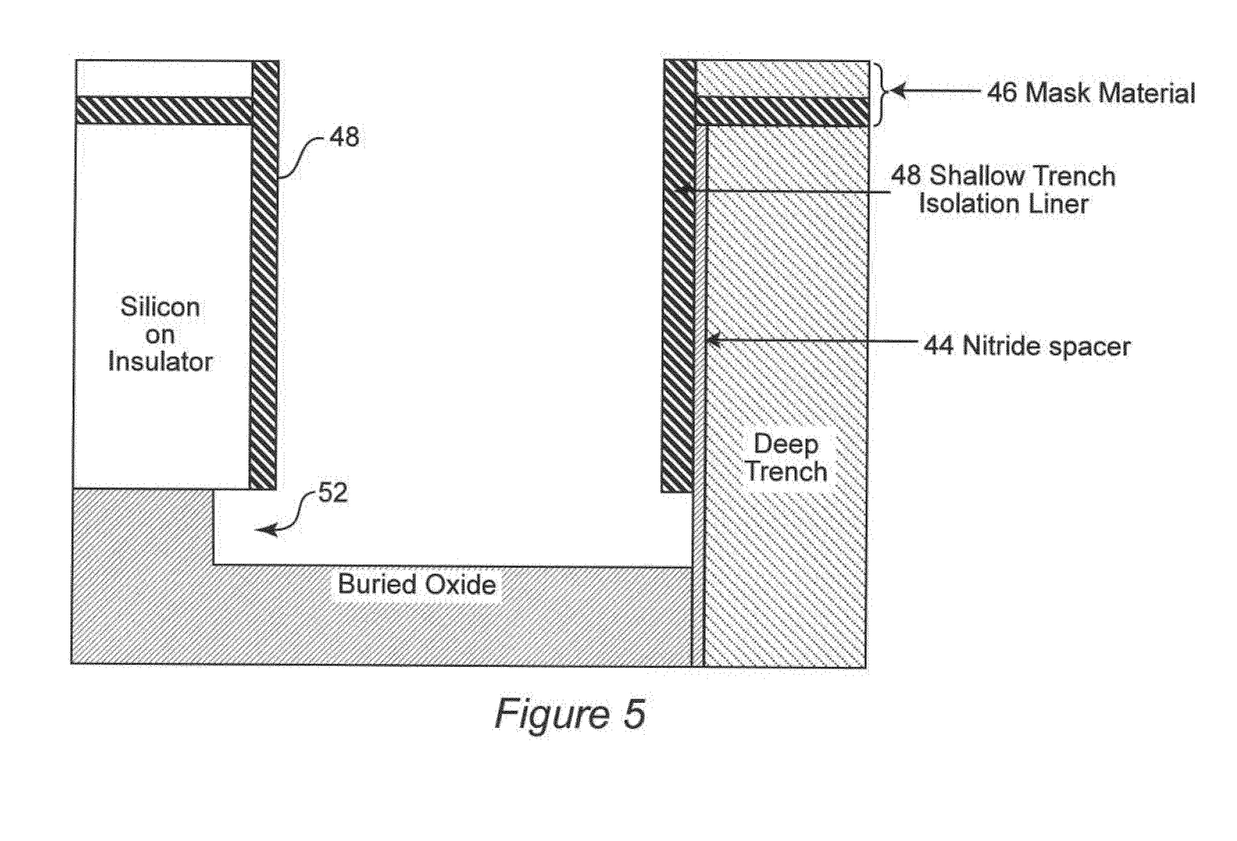

The cross-sectional view shown in FIG. 4 is limited to the region above the handle substrate 36 (FIG. 3). Accordingly, it is to be understood and appreciated that the shape, size, extent and design of the capacitor below the storage node/connection 40 is of no importance to the basic principles of the invention. At the stage of manufacture depicted in FIG. 4, the bottled DT capacitor body or other capacitor body design (not shown in FIGS. 4-6) and the DT connection storage node 40 including a spacer 44 of, for example, nitride (which can form the capacitor dielectric or can be added to the design for purposes of this process), have been formed, the SOI layer has been patterned for formation of transistor T and the region between them has been selectively etched in accordance with patterned mask material 46 to the surface of the BOX 34 (which may also simultaneously pattern the SOI to the design dimensions of transistor T), forming recess or shallow trench 38'. A liner 48 for a shallow trench isolation structure to be formed later is then applied on the sidewalls of recess 38'. The material of the liner is not particularly critical to the successful practice of the invention other than that the BOX and semiconductor material of the SOI layer must be etchable selectively thereto, as shown in FIG. 5. An oxide nitride stack can be used and is preferred for this structure.

FIG. 5 shows the same cross-section illustrated in FIG. 4 after etching the BOX through recess 38'. This etch is only critical to the extent that it must be selective to nitride spacer 44 and STI liner 48 and should not be anisotropic in order to develop an undercut 52 in the BOX below the STI liner 48 which exposes semiconductor material of the SOI layer. Numerous suitable processes, such as the preferred wet etch containing hydrofluoric acid, are known. Nitride spacer 44 protects the DT capacitor connection/storage node structure or any portion of the storage capacitor which is formed at the level of the BOX.

Figure 6:
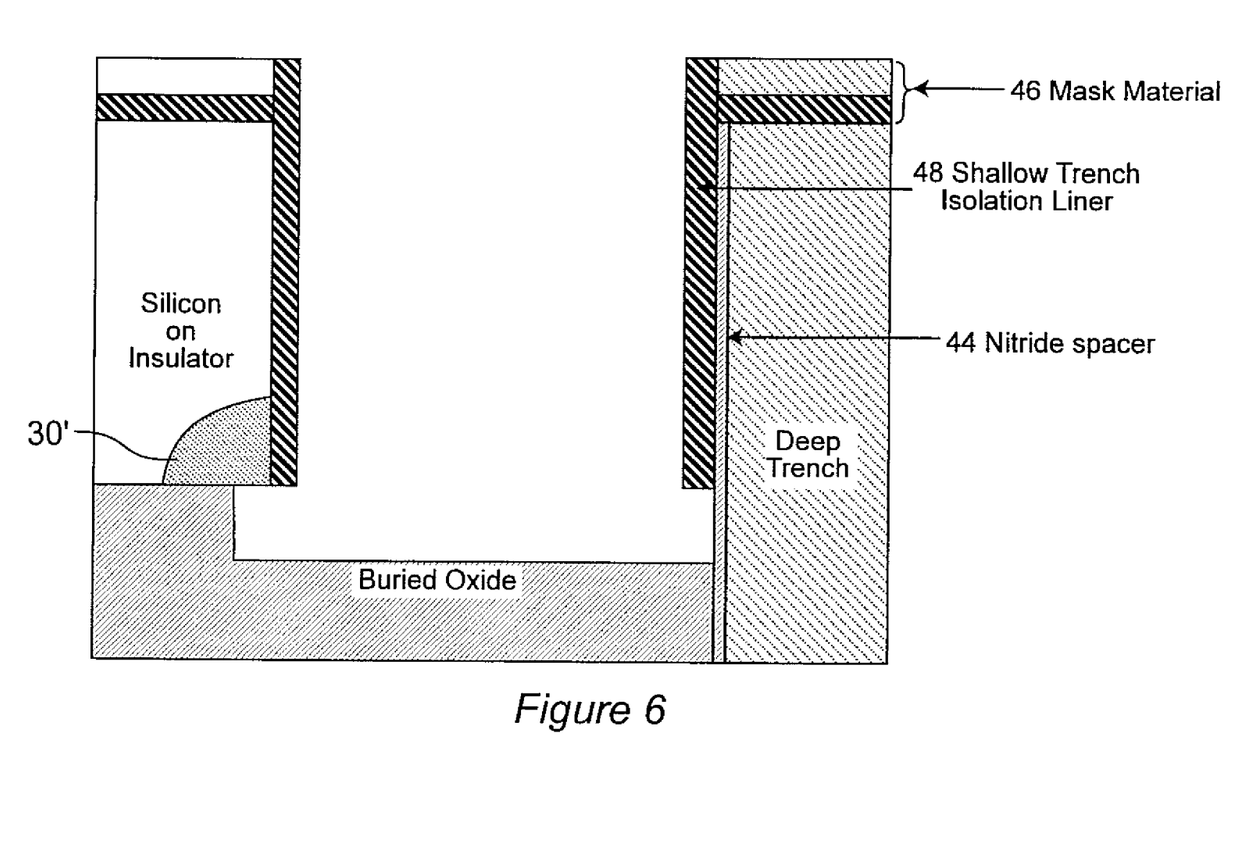

Then, as shown in FIG. 6, the semiconductor material of the SOI layer is etched where it is exposed to the etchant between the remaining BOX and the STI liner 48. It should be noted that mask material 46 remains in place and all surfaces of the semiconductor material in the SOI layer are protected from this etch except at the bottom corners of the patterned SOI which will become the conduction channel of transistor T. It should also be noted that the shape of the etched region is exemplary but can be widely varied by grain orientation in the SOI layer, the etchant, the length of undercut and process parameters. That is, the etch rate may be preferentially horizontal or vertical or some proportional combination of horizontal and vertical to adjust the shape to recess the semiconductor material in a direction away from closely neighboring portions of the storage capacitor structure (e.g. a direction proportionally between H1 and H2 in accordance with the inverse of their respective lengths. In other words, the shape of the region 30' can be shaped, at will, to optimize the relationship of increased distance from portions of the capacitor and storage node while limiting the amount of reduction in cross-section of the channel. Alternatively, the shaping can be chosen to approximate the shape of field lines due to voltage on the gate electrode (e.g. to remove portions of the channel where the field cannot be well-controlled by the gate. One possible choice of profile is depicted by dashed line 301 in FIG. 3. Since the profile of structure 30 can be freely chosen and reliably formed, the lower corners of the conduction channel can be recessed by any desired distance from the capacitors and the width of the bottom of the conduction channel can be narrowed or, if supported in the source and drain regions (in front and in back of the plane of the cross-sections of FIGS. 3-6), even removed to reduce channel depth to any desired degree. That is, the channel can be shaped in substantially any desired fashion to remove regions that may constitute or contribute to a leakage path. Thus, the design threshold of the transistor can be completely decoupled from any change in back channel Vt due to the influence of adjacent storage capacitors or any retro doping which, while not generally required when the invention is employed, may be used if desired, while leakage current may be greatly reduced and on/off resistance ratio greatly improved.

The recess 38' including the void 30' formed by etching the semiconductor material is then preferably filled or partially filled with an oxide or other insulating material to form STI structures 38 (preferably of a width B sufficient to substantially avoid capacitive coupling from the connection/storage node to the sides of the transistor channel near the gate) and fill void 30' to form structure 30 (FIG. 3). As alluded to above, void 30' can be allowed to remain, as well. The degree, if any, to which the void 30' is filled can be regulated at will by the degree of isotropy of the deposition of insulating material in other regions which have been etched as described above. The memory cell structure can then be completed by removal of mask material 46 by, for example, planarizing, completion of the transistors by formation of source, drain and gate structures of any desired design (including any impurity implantation that may be deemed desirable) and application of straps to connect the transistor to the capacitor and other wiring to the transistor.

In view of the foregoing, it is seen that the invention provides a structural alternative to retro doping for control of transistor leakage due to change of back channel Vt by induced charge density from one or more adjacent elements and which is not subject to coupling to upper portions of the transistor channel to alter the desired threshold of the transistor design due to an implanted impurity concentration profile and/or diffusion of boron as has previously been used in an effort to reduce current/charge leakage in transistors, particularly due to the influence of charge stored in capacitors adjacent to the transistor. The invention has no deleterious effect on the performance of the transistor as a pass gate while serving to greatly reduce a leakage path that has been found to become prominent as transistors are scaled to smaller sizes and formed at higher integration densities. The invention is not limited to use in transistors controlling memory cells or in connection with capacitors but can be used to improve performance of transistors in virtually any application, particularly where the voltage on an adjacent structure may reduce the threshold of a portion of the conduction channel. The invention thus provides a structure and method of manufacture which does not depend on doping or any other mechanism for voltage threshold adjustment due to induced effects on electron concentration.

While the invention has been described in terms of a single preferred embodiment, those skilled in the art will recognize that the invention can be practiced with modification within the spirit and scope of the appended claims.

We claim:

1. A transistor comprising a gate structure and source and drain regions and a conduction channel extending between said source and drain regions, wherein a lower portion of lateral sides of said conduction channel is shaped in cross-section to avoid inclusion of a portion of a leakage path within said conduction channel, said cross-section being taken in a direction across a width of said conduction channel and across a width of a conduction path between said source and drain regions, said conduction path and said conduction channel having a length between said source and drain regions.

2. The transistor as recited in claim 1, wherein said lower portion of said channel is a lower corner of said conduction channel.

3. The transistor as recited in claim 2, wherein said lower corner is replaced by an insulating material.

4. The transistor as recited in claim 2, wherein said lower portion is shaped based upon a direction and distance from an adjacent structure in an integrated circuit.

5. The transistor as recited in claim 2, wherein said lower portion is shaped to approximate a shape of field lines resulting from a voltage on said gate structure.

6. The transistor as recited in claim 1, wherein said conduction channel is formed in an SOI layer.

7. A memory cell including
a storage capacitor, and
a transistor, said transistor comprising a gate structure and source and drain regions and a conduction channel extending between said source and drain regions, wherein a lower portion of lateral sides of said conduction channel is shaped in cross-section to avoid inclusion of a portion of a leakage path within said conduction channel, said cross-section being taken in a direction across a width of said conduction channel and across a width of a conduction path, said conduction channel and said conduction path having a length between said source and drain regions.

8. The memory cell as recited in claim 7, wherein said lower portion of said channel is a lower corner of said conduction channel.

9. The memory cell as recited in claim 8, wherein said lower corner is replaced by an insulating material.

10. The memory cell as recited in claim 8, wherein said lower portion is shaped based upon a direction and distance from an adjacent structure in an integrated circuit.

11. The memory cell as recited in claim 8, wherein said lower portion is shaped to approximate a shape of field lines resulting from a voltage on said gate structure.

12. The memory cell as recited in claim 7, wherein said conduction channel is formed in an SOI layer.

13. The memory cell as recited in claim 12, further including a shallow trench isolation structure located between said storage capacitor and said transistor.

14. An integrated circuit including a transistor and another circuit element formed in such proximity to each other that charge on said another circuit element causes a change in threshold voltage in a region of a conduction channel of said transistor opposite a gate structure of said transistor, said conduction channel defining a conduction path, both of which have a length between drain and source regions, said transistor including:
  a region of insulator located at lateral sides of said conduction channel to reduce conduction channel cross-section in a direction across a width of said conduction channel and across a width of a conduction path between said source region and said drain region of said transistor in a region overlaid by said gate structure and most proximate to said another circuit element.

15. The integrated circuit as recited in claim 14 wherein said region of insulator reduces the cross-sectional area of said conduction channel in a region of said conduction channel opposite said gate structure.

16. The integrated circuit as recited in claim 14, wherein said conduction channel is formed in an active layer of a SOI chip.

17. The integrated circuit as recited in claim 16, wherein said another element is a capacitor extending into a handle substrate of said SOI structure.

* * * * *